United States Patent
Otani et al.

[11] 3,939,325
[45] Feb. 17, 1976

[54] THERMAL RECORD PRINTER HEAD AND METHOD OF MAKING THE SAME

[75] Inventors: Hiroshi Otani, Shijonawate; Fujio Oda, Ashiya, both of Japan

[73] Assignee: Matsushita Electric Industrial Co., Ltd., Osaka, Japan

[22] Filed: Nov. 29, 1973

[21] Appl. No.: 420,319

[30] Foreign Application Priority Data
Dec. 1, 1972    Japan................ 47-121024

[52] U.S. Cl............. 219/216; 29/576 R; 357/28; 357/56
[51] Int. Cl.²......................................... H05B 1/00
[58] Field of Search........ 219/216, 543; 357/28, 56; 346/76 R; 29/576–577

[56] References Cited
UNITED STATES PATENTS

| | | | |
|---|---|---|---|
| 3,064,132 | 11/1962 | Strull | 357/28 X |
| 3,515,850 | 6/1970 | Cady, Jr. | 346/76 R X |
| 3,571,919 | 3/1971 | Gleim et al. | 357/28 X |
| 3,612,959 | 10/1971 | Simon | 357/28 |
| 3,700,852 | 10/1972 | Ruggiero | 219/216 |
| 3,813,513 | 5/1974 | Vora et al. | 219/216 |
| 3,813,677 | 5/1974 | Shimotsuma | 219/216 X |
| 3,814,897 | 6/1974 | Otani et al. | 219/216 |

*Primary Examiner*—C. L. Albritton
*Attorney, Agent, or Firm*—Stevens, Davis, Miller & Mosher

[57] ABSTRACT

A thermal record printer head to be used in a thermal record printer, in which a resistive exothermic layer is formed in the front surface of a semiconductor substrate to be adjacent to a thermosensitive record medium and low resistance regions in parts of the back surface to be continuous to the one in the front surface by impurity diffusion, and respective electrodes are attached to the impurity diffusion regions in the back surface thereby enabling high temperature heating, a high thermal response speed and also good productivity, and a method of making the same.

7 Claims, 9 Drawing Figures

THERMAL RECORD PRINTER HEAD AND METHOD OF MAKING THE SAME

This invention relates to a thermal record printer head capable of high temperature heating, having a high thermal response speed and further a good productivity, and a method of making the same.

Various thermal record printer heads have been developed conventionally. As for those using a semiconductor such as silicon, there are basically two kinds; (1) one having an exothermic layer in the back surface of a semiconductor substrate, and (2) one having an exothermic layer in the front surface of a semiconductor adjacent to a thermosensitive record medium.

For printing coded signals, etc., there are usually provided a plurality of heads. In the case of using a semiconductor, a plurality of semiconductor mesas each of which is connected with lead wires is provided usually. For the easiness of mass-production, case (1) is preferable because the exothermic layer and the lead wires can be provided on the same surface and the formation thereof is easy. The structure of case (1), however, has disadvantages in that the thermal response speed is low and that the high temperature heating is difficult.

On the other hand, case (2), in which the exothermic layer is formed in the surface adjacent to the thermosensitive record medium, is preferable for the easiness of attaining high temperature heating and a high thermal response speed, but has a disadvantage that the lead wires should be provided on the other surface than that of the exothermic layer, thus, the impurity diffusion should be extended to the surfaces on which lead wires are to be attached and the formation of such a diffusion layer has been accompanied with poor mass-productivity.

An object of this invention is to provide a thermal record printer head having a high thermal response speed and capable of high temperature heating as well as having good mass-productivity.

Another object of this invention is to provide a thermal record printer head having an exothermal resistive layer in the surface of a semiconductor substrate adjacent to a thermosensitive record medium and a good mass-productivity.

A further object of this invention is to provide a thermal record printer head having good thermal efficiency and good heat dissipation.

According to a typical embodiment of this invention, there is provided a thermal record printer head using a semiconductor substrate comprising an impurity diffused layer formed in a surface of the semiconductor substrate to be adjacent to a thermosensitive recording medium, further impurity diffused regions formed in the back surface of said semiconductor substrate and connected with said impurity diffused layer to make at least said impurity diffused layer work as an exothermic resistive layer, and electrodes provided on said further impurity diffused regions in the back surface.

According to the above embodiment, high temperature heating is possible, the thermal response speed is high, thermal efficiency is good, heat dissipation is also rapid, and the structure is fitted for mass-production. Therefore, when such heads are used in a thermal record printer, stable and solid printing can be performed from the beginning of each use, long time use is possible, and the running speed for the head can be made fast. Thus, this invention has a great industrial value.

Other objects, features and advantages of this invention will become clear from the following description taken in conjunction with the accompanying drawings in which.

For help in understanding the present invention, two typical examples of the conventional thermal record printer head will be described with reference to FIGS. 1 and 2.

Figure 1:
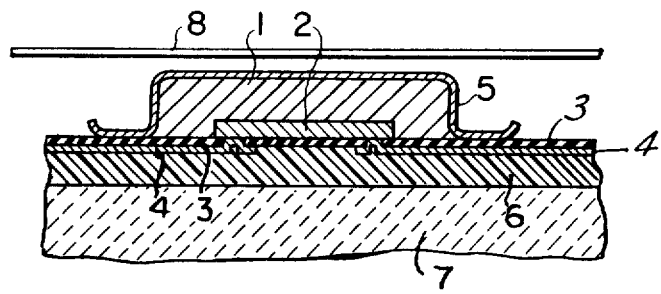
FIGS. 1 and 2 are cross-sections of conventional thermal record printer heads.

FIG. 1 shows an example of the conventional thermal record printer head in which an exothermic resistive layer is formed in the same surface as electrodes thereof. An n- or p-type resistive layer 2 is formed by diffusing an impurity in the surface of a p- or n-type silicon substrate 1 formed in a mesa. On the same surface, electrodes 4 are provided by evaporation, etc. The element thus formed is adhered to a ceramic substrate 7 with epoxy resin 6. The electrodes 4 are insulated from the silicon substrate 1 by oxide films 3. The silicon substrate 1 is protected with a wear-proof hard film 5. By allowing a current to flow through the resistive layer 2, the mesa thereon is heated to enable a thermosensitive record medium 8 brought into contact with the mesa to produce color with this heat.

Figure 2:
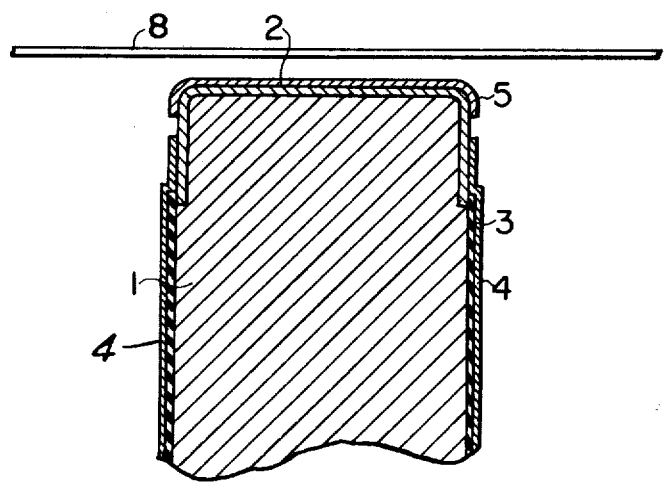

FIG. 2 shows another type of the conventional printer head which is basically similar to that of FIG. 1, but has the exothermic resistive layer 2 in the upper surface and the upper edge portions of the semiconductor substrate 1 such as silicon.

The heat conduction system of the head of FIG. 1 can be illustrated as follows.

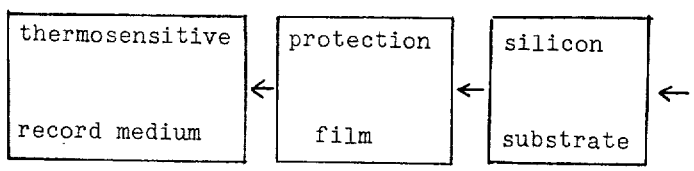

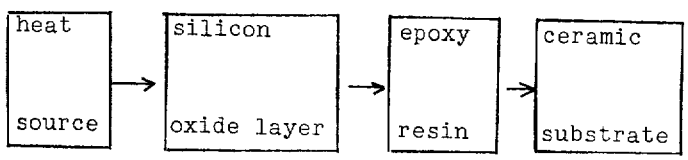

Similarly, the heat conduction system of the head of FIG. 2 can be illustrated as follows.

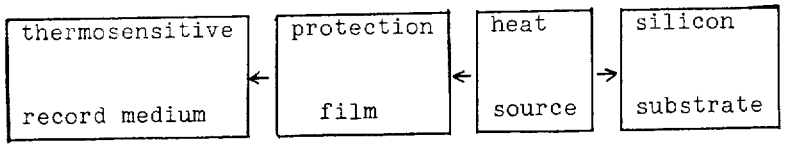

The above structures are considered to have generally the following features, that for the type of FIG. 1:
1. high temperature heating is difficult;
2. thermal response speed is low; and
3. mass-productivity is good, and for the type of FIG. 2:
1. high temperature heating is possible;
2. thermal response speed is high; and
3. mass-productivity is poor.

The heat generated in the exothermic layer, in the case of the former structure, first heats the mesa formed of the silicon substrate 1, then is conducted to the thermosensitive record medium 8 to make it produce color. Since the heat conduction is epoxy resin is extremely small compared to that in silicon, the heat dissipation of the heated mesa is poor, whereby the thermal response speed is low and the printing speed cannot be made fast. In the latter case, since the heat generated in the exothermic layer is directly conducted to the thermosensitive record medium 8 to enable it to produce color and at the same time is dissipated through the silicon substrate 1, the thermal response speed is high and the printing speed can be made fast.

Further, as is apparent from the structure, it is difficult to heat the former head to a high temperature from the point of bad effects given to the epoxy resin 6. In the former head, however, the exothermic resistive element 2 can be formed in the same plane, and thereby the productivity is good. In the latter case, on the contrary to the former case, high temperature heating is possible as can be seen from its structure, but the exothermic resistive element 2 should be formed in the three surfaces of the silicon substrate 1 and thereby the productivity cannot be very good.

The present printer head structure removes the drawbacks of the conventional two types of the structure; with the result that high temperature heating is possible, thermal response speed is high and productivity is good.

Figure 3:
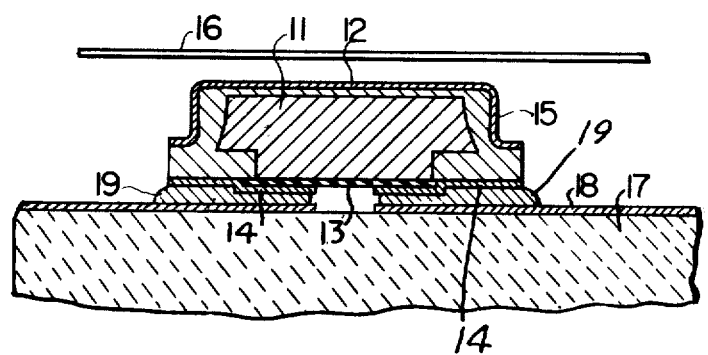
FIG. 3 is a cross-section of an embodiment of the thermal record printer head according to the invention.

FIG. 3 shows an embodiment of the present thermal record printer head, in which numeral 11 indicates a silicon substrate, 12 an exothermic resistive layer formed in the surface of the silicon substrate 11, 13 a silicon oxide film, 14 electrodes, 15 a wear-proof film, 16 a thermosensitive record medium, 17 a ceramic substrate, 18 metalized leads formed on the ceramic substrate 17, and 19 solder layers.

In this thermal record printer head, the mesa structure is adhered to the ceramic substrate 17 with solder. Therefore, the structure can endure extremely higher temperatures than those for the case of using a resin such as epoxy. Further, since the exothermic resistive layer 12 is formed in the surface on which the thermosensitive record medium 16 slides, the conduction of heat is rapid. Also, the heat dissipation is done rapidly since no resin intervenes. Further, impurity diffusion in the exothermic resistive layer 12 is so controlled that the resistivity in the portions not being adjacent to the thermosensitive record medium 16 is negligibly small compared to that in the portion adjacent to the record medium 16. Therefore, no unnecessary heating is done in the mesa (dot) and the heat efficiency is high.

Figure 4A:
FIGS. 4a to 4e are views for explaining various manufacturing steps for the head of FIG. 3.
Figure 4B:
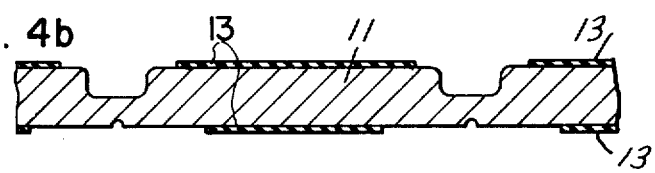
Figure 4C:
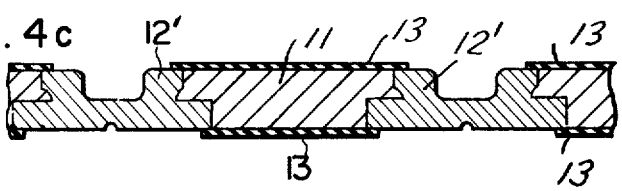
Figure 4D:
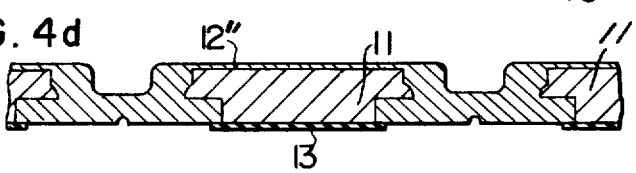
Figure 4E:
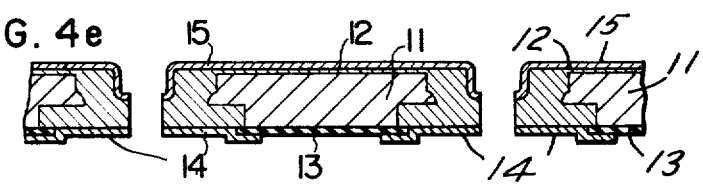

The manufacturing steps of the present thermal record printer head will be described in connection with FIGS. 4a to 4e. First, mesa etching is done for a silicon substrate 11 of an appropriate thickness (0.1 to 0.2 mm) to leave dots desired for heat generation as is shown in FIG. 4a. The depth of the mesa-etching is preferably as deep as possible provided that the wafer treating steps are possible. Practically, it is sufficient to stop etching at a position about 50 μm above the bottom surface. Further, a marker is formed in the surface opposite to that subjected to the mesa-etching as is shown in the figure. Then, a silicon oxide film 13 is formed in the shape as shown in FIG. 4b. This can be done by first oxidizing the whole surface by thermal oxidation, etc. and then selectively photoetching the oxide film. Then, regions 12' having a different conductivity type from that of the silicon substrate 11 are formed by impurity diffusion as is shown in FIG. 4c. In this step, since impurity diffusion is done from the both front and back surfaces until the diffused regions meet each other, for example when the remaining thickness is 50 μm diffusion is done longer than 25 μm from each side, the diffusion time is relatively long and thus those impurities for which the masking effect of the oxide film is extremely large, e.g. boron, are fitted for this impurity diffusion. Thus, it can be recommended to use n-type silicon as the silicon substrate and boron as the impurity for forming the diffused regions 12'. Further, the impurity concentration in this diffused region 12' is preferably as high as possible to attain low resistivity. Then, as is shown in FIG. 4d, the silicon oxide film 13 on the upper surface of the mesa is removed and then an impurity of the same conductivity type as that in the regions 12' is diffused to bridge the regions 12' to form a region 12''. Since this region 12'' functions as the exothermic resistive layer 12, the diffusion is so controlled that the resistance of the region 12'' coincides with that determined from the electrical circuit. Then, as is shown in FIG. 4e, electrodes 14 are formed on the regions 12' in the surface on the opposite side to that provided with the mesa. The material for the electrodes 14 is preferably one which can be soldered. On the mesa, a wear-proof film 15, such as aluminum oxide or silicon carbide, is formed by spattering, thermo-decomposition, etc. Then, the portions in the regions 12' subjected to mesa-etching are cut as in shown in FIG. 4e.

Figure 5:
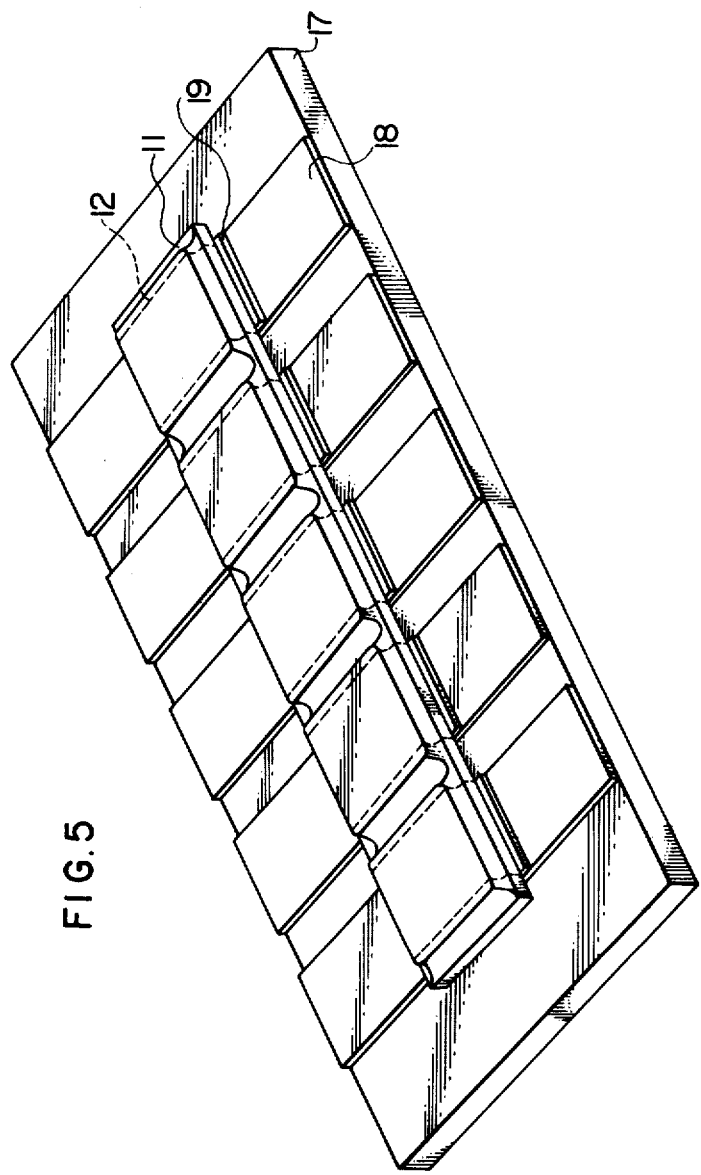
FIG. 5 is a perspective view of an application of the head of FIG. 3.

Thermal record printer heads formed as above are soldered to a ceramic substrate 17 which is preliminarily metalized in a desired form, as is shown in FIGS. 3 and 5. FIG. 5 shows an example in which exothermic elements of five dots are disposed in a line.

What we claim is:
1. A thermal record printer head comprising:
a semiconductor substrate having a front surface and a back surface;
an impurity diffused layer formed in the front surface of the semiconductor substrate to be adjacent to a thermosensitive recording medium;
further impurity diffused regions formed in the back surface of said semiconductor substrate and extending through side portions between said front and said back surfaces of said semiconductor substrate to said impurity diffused layer and to be electrically connected therebetween and to make at least said impurity diffused layer work as an exothermic resistive layer; and electrodes provided on said further impurity diffused regions in the back surface.

2. A thermal record printer head according to claim 1, further comprising a substrate of a heat-resisting insulator provided with leads which are soldered with said electrodes provided on said further impurity diffused regions in the back surface of the semiconductor substrate.

3. A thermal record printer head comprising:
a semiconductor substrate of high resistivity having one main surface and an opposite surface;
an impurity diffused layer formed in the main surface of said semiconductor substrate and having a predetermined resistance suitable for working as an exothermic resistive layer;
further impurity diffused regions formed in edge portions of said impurity diffused layer, extending through the substrate in the thickness direction to the opposite surface of the substrate and having a lower resistance than that of said impurity diffused layer; and electrodes provided on said further impurity diffused regions on said opposite surface of the substrate.

4. A thermal record printer head according to claim 3, in which said impurity diffused layer and regions have the same conductivity type and said semiconductor substrate has an opposite conductivity type to that of the impurity diffused layer and regions.

5. A thermal record printer head according to claim 3, further comprising a heat-resisting and insulating substrate provided with metalized leads which are directly soldered with said electrodes.

6. A thermal record printer head according to claim 1 further comprising a wear proof film which covers said impurity diffused layer.

7. A thermal record printer head according to claim 3 wherein only a portion of said substrate has diffused regions and further comprising an insulating film on said opposite surface of said substrate and separating said electrodes from the portion of said substrate without diffused regions.

* * * * *